(12) United States Patent
Kidoh et al.

(10) Patent No.: US 8,436,415 B2
(45) Date of Patent: May 7, 2013

(54) NONVOLATILE SEMICONDUCTOR MEMORY DEVICE AND METHOD OF MANUFACTURING THE SAME

(75) Inventors: Masaru Kidoh, Komae (JP); Ryota Katsumata, Yokkaichi (JP); Masaru Kito, Yokohama (JP); Yoshiaki Fukuzumi, Yokohama (JP); Hiroyasu Tanaka, Yokkaichi (JP); Yosuke Komori, Yokkaichi (JP); Megumi Ishiduki, Yokkaichi (JP); Tomoko Fujiwara, Yokohama (JP); Hideaki Aochi, Kawasaki (JP); Ryouhei Kirisawa, Yokohama (JP); Yoshimasa Mikajiri, Yokohama (JP); Shigeto Oota, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 558 days.

(21) Appl. No.: 12/723,981

(22) Filed: Mar. 15, 2010

(65) Prior Publication Data

US 2011/0049608 A1    Mar. 3, 2011

(30) Foreign Application Priority Data

Sep. 2, 2009  (JP) .................................. 2009-203075

(51) Int. Cl.
*H01L 29/792*  (2006.01)
(52) U.S. Cl.
USPC .... 257/324; 257/325; 257/326; 257/E29.309; 257/E21.645; 257/E27.103

(58) Field of Classification Search .......... 257/324–326, 257/E29.309, E21.645, E27.103
See application file for complete search history.

(56) References Cited

U.S. PATENT DOCUMENTS 7,936,004 B2   5/2011  Kito et al.

FOREIGN PATENT DOCUMENTS

JP    2007-266143       10/2007
WO   WO 2009/075370 A1   6/2009

OTHER PUBLICATIONS

U.S. Appl. No. 12/679,991, filed Mar. 25, 2010, Fukuzumi, et al.

*Primary Examiner* — Samuel Gebremariam
(74) *Attorney, Agent, or Firm* — Oblon, Spivak, McClelland, Maier & Neustadt, L.L.P.

(57) ABSTRACT

A memory string comprises: a first semiconductor layer including a columnar portion extending in a stacking direction on a substrate; a first charge storage layer surrounding the columnar portion; and a plurality of first conductive layers stacked on the substrate so as to surround the first charge storage layer. A select transistor comprises: a second semiconductor layer in contact with an upper surface of the columnar portion and extending in the stacking direction; a second charge storage layer surrounding the second semiconductor layer; and a second conductive layer deposited above the first conductive layer to surround the second charge storage layer. The second charge storage layer is formed from a layer downward of the second conductive layer to an upper end vicinity of the second conductive layer, and is not formed in a layer upward of the upper end vicinity.

16 Claims, 8 Drawing Sheets

NONVOLATILE SEMICONDUCTOR MEMORY DEVICE AND METHOD OF MANUFACTURING THE SAME

CROSS REFERENCE TO RELATED APPLICATIONS

This application is based upon and claims the benefit of priority from the prior Japanese Patent Application No. 2009-203075, filed on Sep. 2, 2009, the entire contents of which are incorporated herein by reference.

BACKGROUND OF THE INVENTION

1. Field of the Invention

The present invention relates to an electrically data-rewritable nonvolatile semiconductor memory device and a method of manufacturing the same.

2. Description of the Related Art

Conventionally, an LSI is formed by integrating elements in a two-dimensional plane on a silicon substrate. The only way to increase a storage capacity of memory is by reducing dimensions of (miniaturizing) an element. However, in recent years, even this miniaturization is becoming difficult in terms of cost and technology. Improvements in photolithographic technology are necessary for miniaturization, but, for example, in current ArF immersion lithography technology, a rule of around 40 nm represents the resolution limit, and further miniaturization requires introduction of EUV steppers. However, the introduction of EUV steppers is problematic due to their high cost. Moreover, even if miniaturization is achieved, it is expected that physical limitations such as those of withstand voltage between elements are encountered, unless the drive voltage and so on are scaled. In other words, there is a high possibility that operation as a device becomes difficult.

Accordingly, in recent years, many semiconductor memory devices are proposed in which memory cells are disposed three-dimensionally in order to increase a degree of integration of memory (refer to Japanese Unexamined Patent Application Publication No. 2007-266143).

SUMMARY OF THE INVENTION

In accordance with a first aspect of the present invention, a nonvolatile semiconductor memory device comprises: a memory string having a plurality of electrically rewritable memory cells connected in series; and a first select transistor connected to one end of the memory string and configured to be conductive when the memory string is selected, the memory string comprising: a first semiconductor layer including a columnar portion extending in a stacking direction on a substrate and functioning as a channel of the memory cells; a first charge storage layer surrounding the columnar portion and retaining data of the memory cells by storing a charge; and a plurality of first conductive layers stacked on the substrate so as to surround the first charge storage layer and functioning as control electrodes of the memory cells, the first select transistor comprising: a second semiconductor layer in contact with an upper surface of the columnar portion and extending in the stacking direction, and functioning as a channel of the first select transistor; a second charge storage layer surrounding the second semiconductor layer and changing a threshold voltage of the first select transistor by storing a charge; and a second conductive layer deposited above the first conductive layer to surround the second charge storage layer and functioning as a control electrode of the first select transistor, the second charge storage layer being formed from a layer downward of the second conductive layer to an upper end vicinity of the second conductive layer, and being not formed in a layer upward of the upper end vicinity.

In accordance with a second aspect of the present invention, a nonvolatile semiconductor memory device comprises: a memory string having a plurality of electrically rewritable memory cells connected in series; and a select transistor connected to one end of the memory string and configured to be conductive when the memory string is selected, the select transistor comprising: a semiconductor layer extending in a stacking direction and functioning as a channel of the select transistor; a charge storage layer surrounding the semiconductor layer and changing a threshold voltage of the select transistor by storing a charge; and a conductive layer deposited to surround the charge storage layer and functioning as a control electrode of the select transistor, the charge storage layer being formed from a layer downward of the conductive layer to an upper end vicinity of the conductive layer, and being not formed in a layer upward of the upper end vicinity.

In accordance with a third aspect of the present invention, a method of manufacturing a nonvolatile semiconductor memory device, the nonvolatile semiconductor memory device including a memory string having a plurality of electrically rewritable memory cells connected in series, and a select transistor connected to one end of the memory string and configured to be conductive when the memory string is selected, comprises: during formation of the select transistor, depositing a first conductive layer sandwiched by a first interlayer insulating layer; forming a hole penetrating the first interlayer insulating layer and the first conductive layer; depositing a first insulating layer and a charge storage layer on a side surface of the hole; depositing a protective layer inside the hole to an upper end vicinity of the first conductive layer; removing the charge storage layer to the upper end vicinity of the first conductive layer using the protective layer as a mask; depositing a second insulating layer on a side surface of the first insulating layer and the charge storage layer facing the hole; and forming a semiconductor layer to fill the hole.

DETAILED DESCRIPTION OF THE EMBODIMENTS

An embodiment of a nonvolatile semiconductor memory device in accordance with the present invention is described below with reference to the drawings.

[Embodiment]

[Configuration of a Nonvolatile Semiconductor Memory Device 100 in Accordance with an Embodiment]

Figure 1:
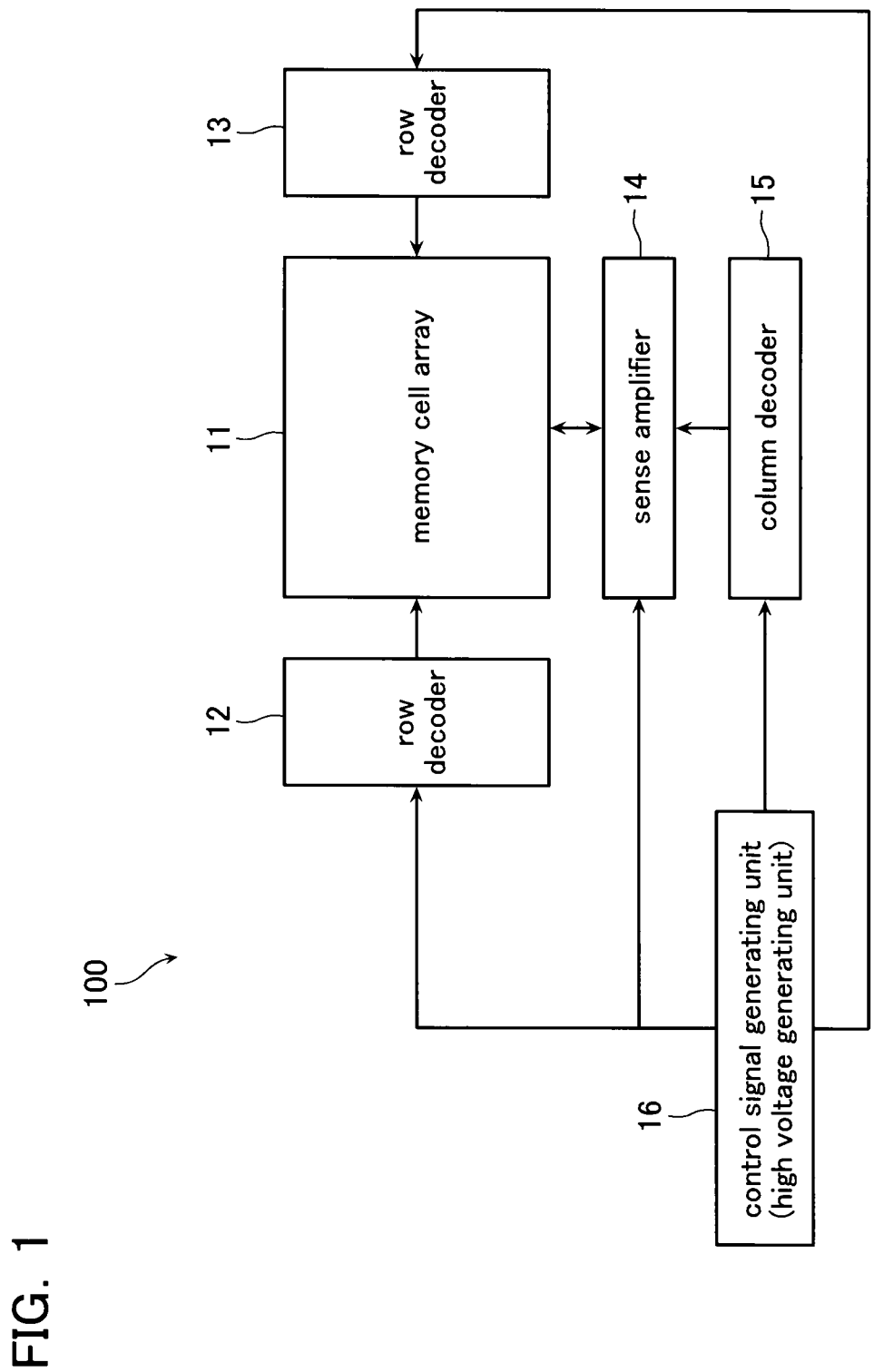
FIG. 1 is a block diagram of a nonvolatile semiconductor memory device 100 in accordance with an embodiment of the present invention.

First, a configuration of a nonvolatile semiconductor memory device 100 in accordance with an embodiment is described with reference to FIG. 1. FIG. 1 is a block diagram of the nonvolatile semiconductor memory device 100 in accordance with the embodiment of the present invention.

As shown in FIG. 1, the nonvolatile semiconductor memory device 100 in accordance with the embodiment comprises a memory cell array 11, row decoders 12 and 13, a sense amplifier 14, a column decoder 15, and a control signal generating unit (high voltage generating unit) 16.

Figure 2:
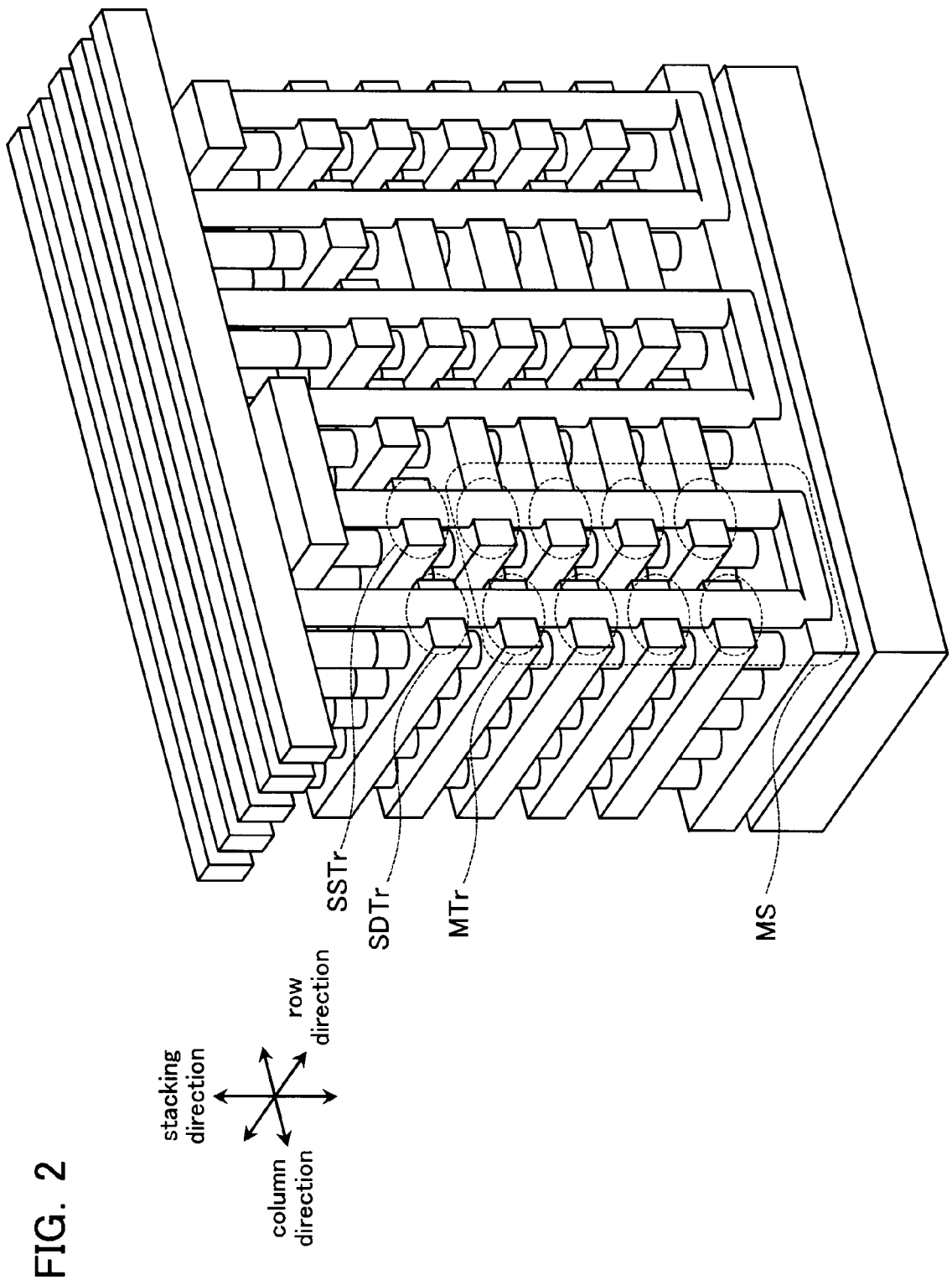
FIG. 2 is a schematic perspective view of the nonvolatile semiconductor memory device 100 in accordance with the embodiment.

As shown in FIG. 2, the memory cell array 11 is configured having electrically data-storing memory transistors MTr (word line conductive layers 41) arranged in a three-dimensional matrix. That is, the memory transistors MTr, as well as being arranged in a matrix in a horizontal direction, are also arranged in a stacking direction. A plurality of the memory transistors MTr aligned in the stacking direction are connected in series to configure a widely known NAND string MS. Connected to the two ends of the NAND string MS are, respectively, a drain side select transistor SDTr and a source side select transistor SSTr, which are rendered conductive when selected. The NAND string MS is arranged having the stacking direction as a long direction.

The row decoders 12 and 13 decode a block address signal and so on downloaded thereto, and control the memory cell array 11. The sense amplifier 14 reads data from the memory cell array 11. The column decoder 15 decodes a column address signal and controls the sense amplifier 14. The control signal generating unit 16 boosts a reference voltage to generate a high voltage required during write and erase, and, further, generates a control signal to control the row decoders 12 and 13, the sense amplifier 14, and the column decoder 15.

Figure 3:
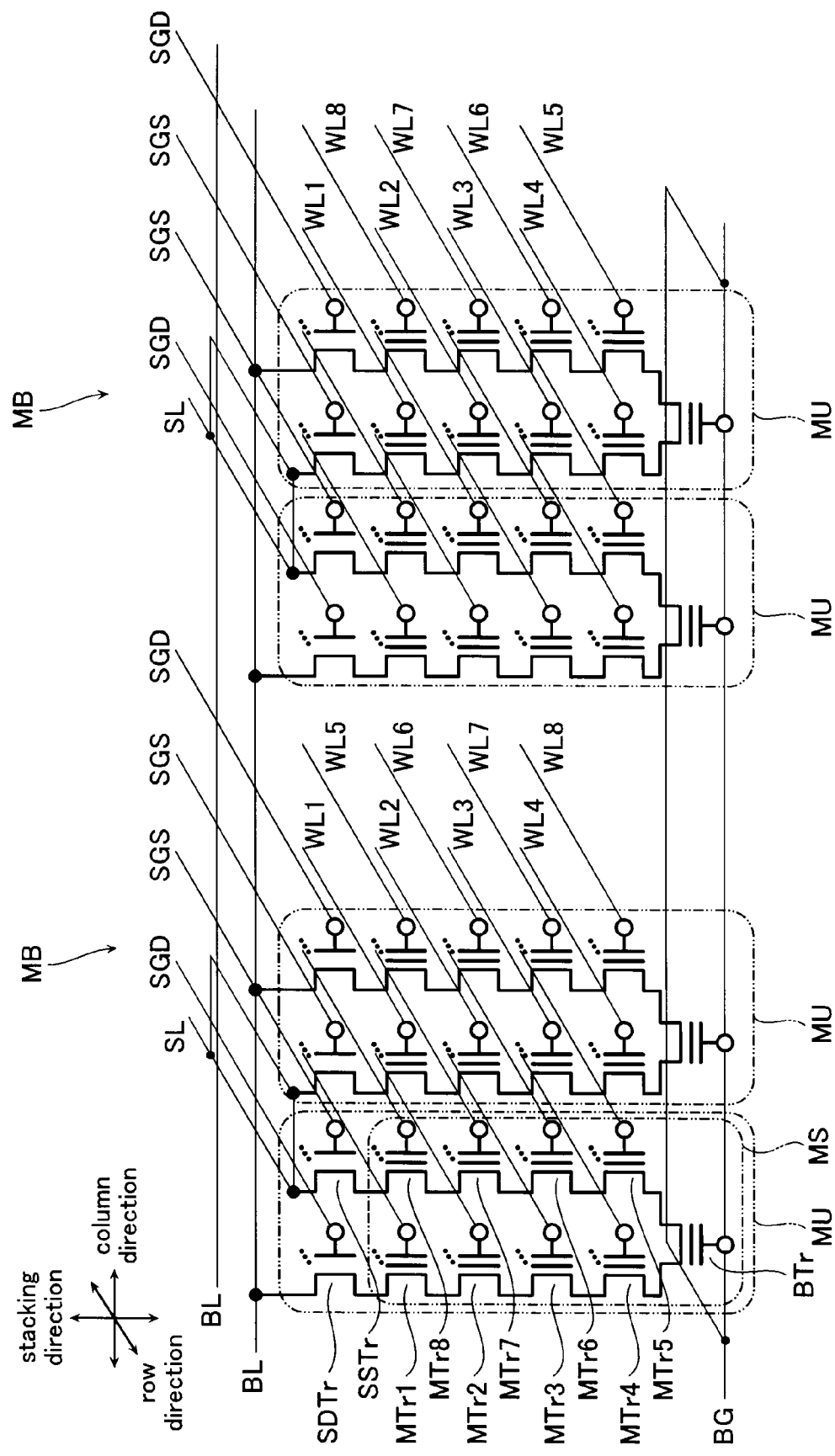
FIG. 3 is an equivalent circuit diagram of the nonvolatile semiconductor memory device 100 in accordance with the embodiment.

Next, a circuit configuration of the memory cell array 11 is described with reference to FIG. 3. FIG. 3 is an equivalent circuit diagram of the memory transistors MTr, the drain side select transistor SDTr, the source side select transistor SSTr, and a peripheral circuit thereof, formed along a cross-section in a column direction of the memory cell array 11.

As shown in FIG. 3, the memory cell array 11 includes a plurality of bit lines BL and a plurality of memory blocks MB. The bit lines BL are formed in stripes extending in the column direction and having a certain pitch in a row direction. The memory blocks MB are provided repeatedly in the column direction with a certain pitch.

As shown in FIG. 3, each of the memory blocks MB includes a plurality of memory units MU commonly connected to the bit lines BL. Each of the memory units MU includes the memory string MS, the source side select transistor SSTr, and the drain side select transistor SDTr. The memory units MU adjacent in the column direction are formed such that a configuration thereof is mutually symmetrical in the column direction. The memory units MU are arranged in a matrix in the row direction and the column direction.

The memory string MS is configured by memory transistors MTr1-MTr8 and a back gate transistor BTr connected in series. The memory transistors MTr1-MTr4 are connected in series in the stacking direction. The memory transistors MTr5-MTr8 also are similarly connected in series in the stacking direction. The memory transistors MTr1-MTr8 store information by trapping a charge in a charge storage layer. The back gate transistor BTr is connected between the lowermost layer memory transistors MTr4 and MTr5. The memory transistors MTr1-MTr8 and the back gate transistor BTr are thus connected in a U shape in a cross-section in the column direction. A source of the drain side select transistor SDTr is connected to one end of the memory string MS (a drain of the memory transistor MTr1). A drain of the source side select transistor SSTr is connected to the other end of the memory string MS (a source of the memory transistor MTr8).

Gates of the memory transistors MTr1 in the memory units MU arranged in a line in the row direction are commonly connected to a word line WL1 extending in the row direction. Similarly, gates of the memory transistors MTr2-MTr8 arranged in lines in the row direction are commonly connected to word lines WL2-WL8, respectively, extending in the row direction. Note that two memory strings MS adjacent in the column direction both share the word lines WL1-WL8. Moreover, gates of the back gate transistors BTr arranged in a matrix in the row direction and the column direction are commonly connected to a back gate line BG.

Gates of each of the drain side select transistors SDTr in the memory units MU arranged in a line in the row direction are commonly connected to a drain side select gate line SGD extending in the row direction. Moreover, drains of the drain side select transistors SDTr arranged in a line in the column direction are commonly connected to the bit line BL.

Gates of each of the source side select transistors SSTr in the memory units MU arranged in a line in the row direction are commonly connected to a source side select gate line SGS extending in the row direction. Moreover, in pairs of the memory units MU adjacent in the column direction, sources of the source side select transistors SSTr arranged in a line in the row direction are commonly connected to a source line SL extending in the row direction.

Figure 4:
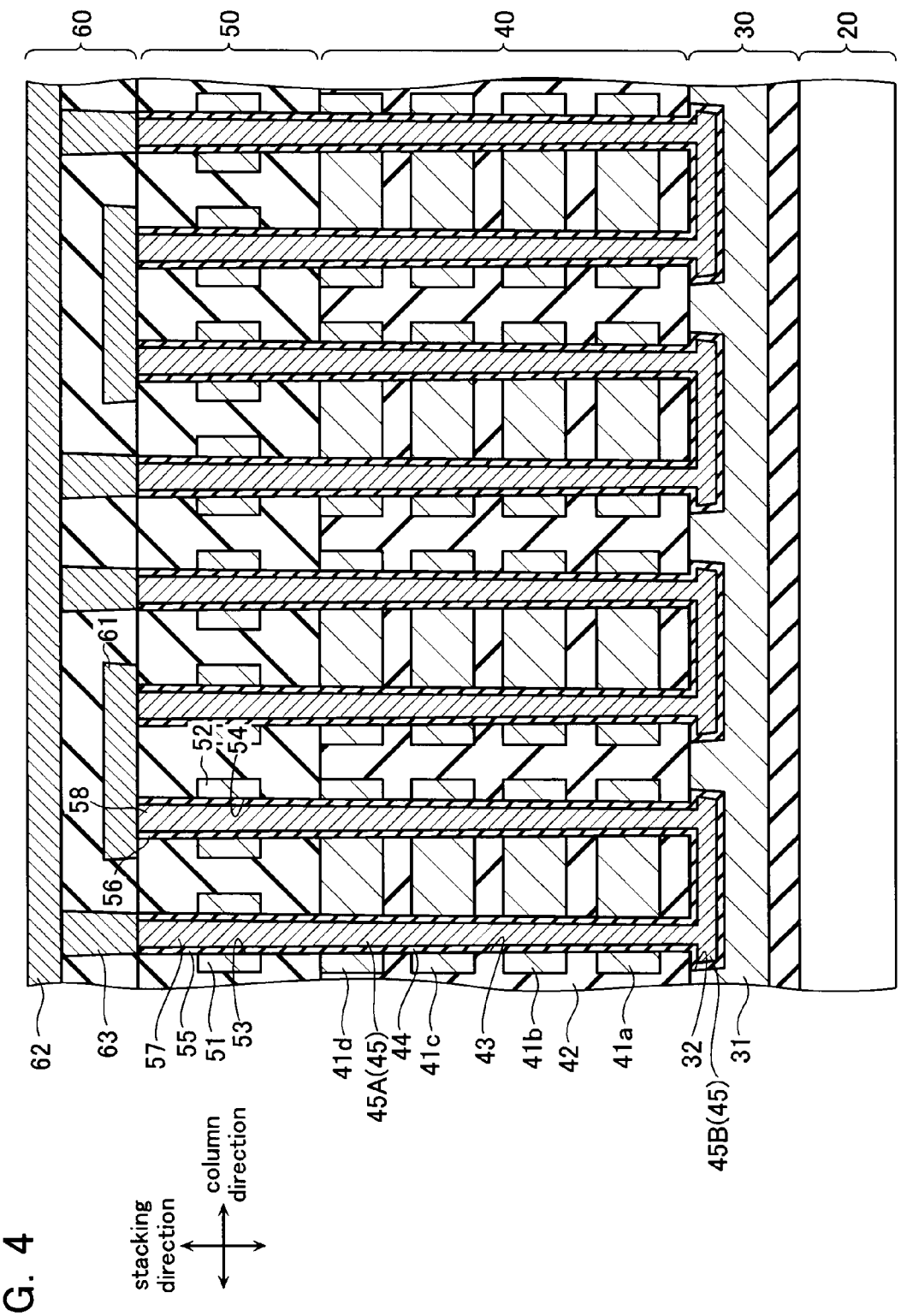
FIG. 4 is a cross-sectional view of the nonvolatile semiconductor memory device 100 in accordance with the embodiment.
Figure 5:
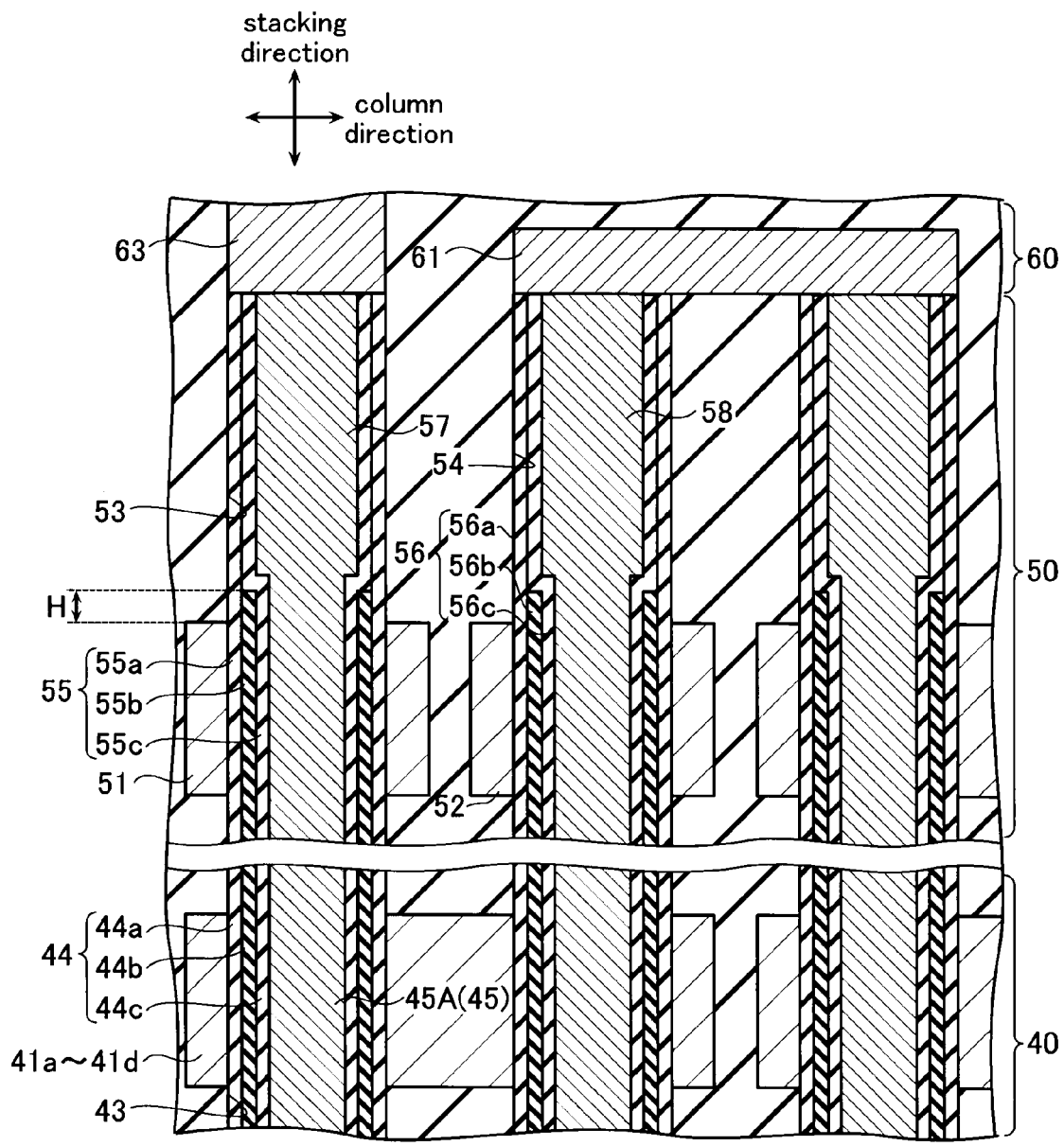
FIG. 5 is an enlarged view of FIG. 4.

Next, a stacking structure of the nonvolatile semiconductor memory device 100 in accordance with the embodiment configured to realize the circuit configuration shown in FIG. 3 is described with reference to FIGS. 4 and 5. FIG. 4 is a cross-sectional view of the nonvolatile semiconductor memory device 100 in accordance with the embodiment, and FIG. 5 is an enlarged view of FIG. 4.

As shown in FIG. 4, the memory cell array 11 includes a substrate 20, and, sequentially from a lower layer, a back gate layer 30, a memory transistor layer 40, a select transistor layer 50, and a wiring layer 60. The back gate layer 30 functions as the back gate transistor BTr. The memory transistor layer 40 functions as the memory transistors MTr1-MTr8. The select transistor layer 50 functions as the drain side select transistor SDTr and the source side select transistor SSTr. The wiring layer 60 functions as the source line SL and the bit line BL.

The back gate layer 30 includes a back gate conductive layer 31 formed on the substrate 20 with an insulating layer interposed therebetween, as shown in FIG. 4. The back gate conductive layer 31 functions as the back gate line BG and as a gate of the back gate transistor BTr. The back gate conductive layer 31 is formed in a planar shape extending in the row direction and the column direction. The back gate conductive layer 31 covers a lower surface and a side surface of a joining portion 45B of a U-shaped semiconductor layer 45 to be described hereafter, and is formed to the same height as an upper surface of the joining portion 45B. The back gate conductive layer 31 is constituted by polysilicon (poly-Si).

In addition, the back gate layer 30 includes a back gate trench 32 formed so as to dig out the back gate conductive layer 31, as shown in FIG. 4. The back gate trench 32 is configured as an opening having a short side in the row direction and a long side in the column direction. The back gate trenches 32 are formed in a matrix at certain intervals in the row direction and the column direction.

The memory transistor layer 40 includes word line conductive layers 41a-41d formed in the stacking direction with an insulating layer 42 interposed therebetween, as shown in FIG. 4. The word line conductive layers 41a-41d function as the word lines WL1-WL8 and as gates of the memory transistors MTr1-MTr8. The word line conductive layers 41a-41d are formed in stripes extending in the row direction and having a certain pitch in the column direction. The word line conductive layers 41a-41d are constituted by polysilicon (poly-Si).

In addition, the memory transistor layer 40 includes a memory hole 43 formed so as to penetrate the word line conductive layers 41a-41d and the insulating layer 42, as shown in FIG. 4.

The memory hole 43 is formed so as to be aligned with a position of the two end vicinities in the column direction of each back gate trench 32. The memory holes 43 are formed in a matrix in the row direction and the column direction.

In addition, the above-described back gate layer 30 and memory transistor layer 40 include a memory gate insulating layer 44 and the U-shaped semiconductor layer 45, as shown in FIG. 4. The U-shaped semiconductor layer 45 functions as a channel of the memory transistors MTr1-MTr8 and the back gate transistor BTr.

The memory gate insulating layer 44 is formed on a side surface facing the memory hole 43 and the back gate trench 32, as shown in FIG. 4. The memory gate insulating layer 44 is configured by a block insulating layer 44a, a charge storage layer 44b, and a tunnel insulating layer 44c, as shown in FIG. 5. The block insulating layer 44a is formed along the side surface of the memory hole 43 and the back gate trench 32 so as to be in contact with the word line conductive layers 41a-41d and the back gate conductive layer 31. The block insulating layer 44a is constituted by silicon oxide ($SiO_2$). The charge storage layer 44b is formed on a side surface of the block insulating layer 44a.

The charge storage layer 44b is used to store a charge, thereby retaining data of the memory transistors MTr1-MTr8. The charge storage layer 44b is constituted by silicon nitride (SiN). The tunnel insulating layer 44c is formed on a side surface of the charge storage layer 44b. The tunnel insulating layer 44c is constituted by silicon oxide ($SiO_2$).

The U-shaped semiconductor layer 45 is formed in a U shape as viewed from the row direction, as shown in FIG. 4. The U-shaped semiconductor layer 45 is formed so as to be in contact with the tunnel insulating layer 44c and so as to fill the back gate trench 32 and the memory hole 43, as shown in FIG. 5. The U-shaped semiconductor layer 45 includes a pair of columnar portions 45A extending in a perpendicular direction with respect to the substrate 20 as viewed from the row direction, and the joining portion 45B formed so as to join lower ends of the pair of columnar portions 45A. The U-shaped semiconductor layer 45 is constituted by polysilicon (poly-Si).

Expressing the above-described configuration of the memory transistor layer 40 in other words, the tunnel insulating layer 44c is formed so as to surround a side surface of the columnar portion 45A. The charge storage layer 44b is formed so as to surround a side surface of the tunnel insulating layer 44c. The block insulating layer 44a is formed so as to surround a side surface of the charge storage layer 44b. The word line conductive layers 41a-41d are formed so as to surround a side surface of the block insulating layer 44a.

The select transistor layer 50 includes a drain side conductive layer 51 and a source side conductive layer 52 formed in the same layer as the drain side conductive layer 51, as shown in FIG. 4. The drain side conductive layer 51 functions as the drain side select gate line SGD and as a gate of the drain side select transistor SDTr. The source side conductive layer 52 functions as the source side select gate line SGS and as a gate of the source side select transistor SSTr.

The drain side conductive layer 51 and the source side conductive layer 52 are formed in stripes extending in the row direction and having a certain pitch in the column direction. The drain side conductive layer 51 and the source side conductive layer 52 are provided alternately two at a time in the column direction. The drain side conductive layer 51 and the source side conductive layer 52 are constituted by polysilicon (poly-Si).

In addition, the select transistor layer 50 includes a drain side hole 53 and a source side hole 54, as shown in FIG. 4. The drain side hole 53 is formed continuously with the memory hole 43 so as to penetrate the drain side conductive layer 51. The source side hole 54 is formed continuously with the memory hole 43 so as to penetrate the source side conductive layer 52. The drain side hole 53 and the source side hole 54 are formed at a position aligning with the memory hole 43.

Moreover, the select transistor layer 50 includes a drain side gate insulating layer 55, a source side gate insulating layer 56, a drain side columnar semiconductor layer 57 which functions as a channel of the drain side select transistor SDTr, and a source side columnar semiconductor layer 58 which functions as a channel of the source side select transistor SSTr, as shown in FIG. 4.

The drain side gate insulating layer 55 is formed on a side surface of the drain side hole 53. The drain side gate insulating layer 55 is configured by a block insulating layer 55a, a charge storage layer 55b, and a tunnel insulating layer 55c, as shown in FIG. 5. The block insulating layer 55a is formed continuously in an integrated manner with the block insulating layer 44a. The charge storage layer 55b is formed continuously in an integrated manner with the charge storage layer 44b. Moreover, the tunnel insulating layer 55c is formed continuously in an integrated manner with the tunnel insulating layer 44c.

The block insulating layer 55a is formed along the side surface of the drain side hole 53 so as to be in contact with the drain side conductive layer 51. The block insulating layer 55a is formed to a more upward position than an upper end of the charge storage layer 55b. The block insulating layer 55a is constituted by silicon oxide ($SiO_2$).

The charge storage layer 55b is formed only in a layer downward of an upper end vicinity of the drain side conductive layer 51, and is not formed in a layer upward of the upper end vicinity of the drain side conductive layer 51. More specifically, the charge storage layer 55b is formed to a position of a certain height H as viewed from the upper end of the drain side conductive layer 51, and is not formed in a layer upward thereof. Here, a certain height H is a border of a region where a voltage applied to the drain side conductive layer 51 may cause a charge to be stored in or discharged from the charge storage layer 55b. The charge storage layer 55b is constituted by silicon nitride (SiN).

The tunnel insulating layer 55c is formed along a side surface of the charge storage layer 55b and a side surface of the block insulating layer 55a. The tunnel insulating layer 55c is formed to a more upward position than the upper end of the charge storage layer 55b. The tunnel insulating layer 55c is constituted by silicon oxide ($SiO_2$).

The source side gate insulating layer 56 is formed on aside surface of the source side hole 54. The source side gate insulating layer 56 is configured by a block insulating layer 56a, a charge storage layer 56b, and a tunnel insulating layer 56c, as shown in FIG. 5. The block insulating layer 56a is formed continuously in an integrated manner with the block insulating layer 44a. The charge storage layer 56b is formed continuously in an integrated manner with the charge storage layer 44b. Moreover, the tunnel insulating layer 56c is formed continuously in an integrated manner with the tunnel insulating layer 44c.

The block insulating layer 56a is formed along the side surface of the source side hole 54 so as to be in contact with the source side conductive layer 52. The block insulating layer 56a is formed to a more upward position than an upper end of the charge storage layer 56b. The block insulating layer 56a is constituted by silicon oxide ($SiO_2$).

The charge storage layer 56b is formed only in a layer downward of an upper end vicinity of the source side conductive layer 52, and is not formed in a layer upward of the upper end vicinity of the source side conductive layer 52. More specifically, the charge storage layer 56b is formed to a position of a certain height H as viewed from the upper end of the source side conductive layer 52, and is not formed in a layer upward thereof. Here, a certain height H is a border of a region where a voltage applied to the source side conductive layer 52 may cause a charge to be stored in or discharged from the charge storage layer 56b. The charge storage layer 56b is constituted by silicon nitride (SiN).

The tunnel insulating layer 56c is formed along a side surface of the charge storage layer 56b and a side surface of the block insulating layer 56a. The tunnel insulating layer 56c is formed to a more upward position than the upper end of the charge storage layer 56b. The tunnel insulating layer 56c is constituted by silicon oxide ($SiO_2$).

The drain side columnar semiconductor layer 57 is formed in a column shape extending in the stacking direction and in contact with the drain side gate insulating layer 55, and so as to fill the drain side hole 53. The source side columnar semiconductor layer 58 is formed in a column shape extending in the stacking direction and in contact with the source side gate insulating layer 56, and so as to fill the source side hole 54. The drain side columnar semiconductor layer 57 and the source side columnar semiconductor layer 58 are constituted by polysilicon (poly-Si).

Expressing the above-described configuration of the select transistor layer 50 in other words, the drain side gate insulating layer 55 is formed so as to surround a side surface of the drain side columnar semiconductor layer 57. The drain side conductive layer 51 is formed so as to surround a side surface of the drain side gate insulating layer 55. The source side gate insulating layer 56 is formed so as to surround a side surface of the source side columnar semiconductor layer 58. The source side conductive layer 52 is formed so as to surround a side surface of the source side gate insulating layer 56.

The wiring layer 60 includes a first wiring layer 61, a second wiring layer 62, and a plug layer 63, as shown in FIG. 4. The first wiring layer 61 functions as the source line SL. The second wiring layer 62 functions as the bit line BL.

The first wiring layer 61 is formed so as to be commonly in contact with upper surfaces of adjacent two of the source side columnar semiconductor layers 58, as shown in FIG. 4. The first wiring layer 61 is formed in stripes extending in the row direction and having a certain pitch in the column direction. The first wiring layer 61 is constituted by a metal such as tungsten (W).

The second wiring layer 62 is connected to an upper surface of the drain side columnar semiconductor layer 57 via the plug layer 63, as shown in FIG. 4. The second wiring layer 62 is formed in stripes extending in the column direction and having a certain pitch in the row direction. The second wiring layer 62 is constituted by a metal such as copper (Cu), and the plug layer 63 is constituted by a metal such as tungsten (W).

[Method of Manufacturing a Nonvolatile Semiconductor Memory Device in Accordance with the Embodiment]

Next, a method of manufacturing the nonvolatile semiconductor memory device 100 in accordance with the embodiment is described with reference to FIGS. 6-11. FIGS. 6-11 are cross-sectional views showing manufacturing processes of the nonvolatile semiconductor memory device 100 in accordance with the embodiment. Note that FIGS. 6-11 show only manufacturing processes of the select transistor layer 50.

Figure 6:
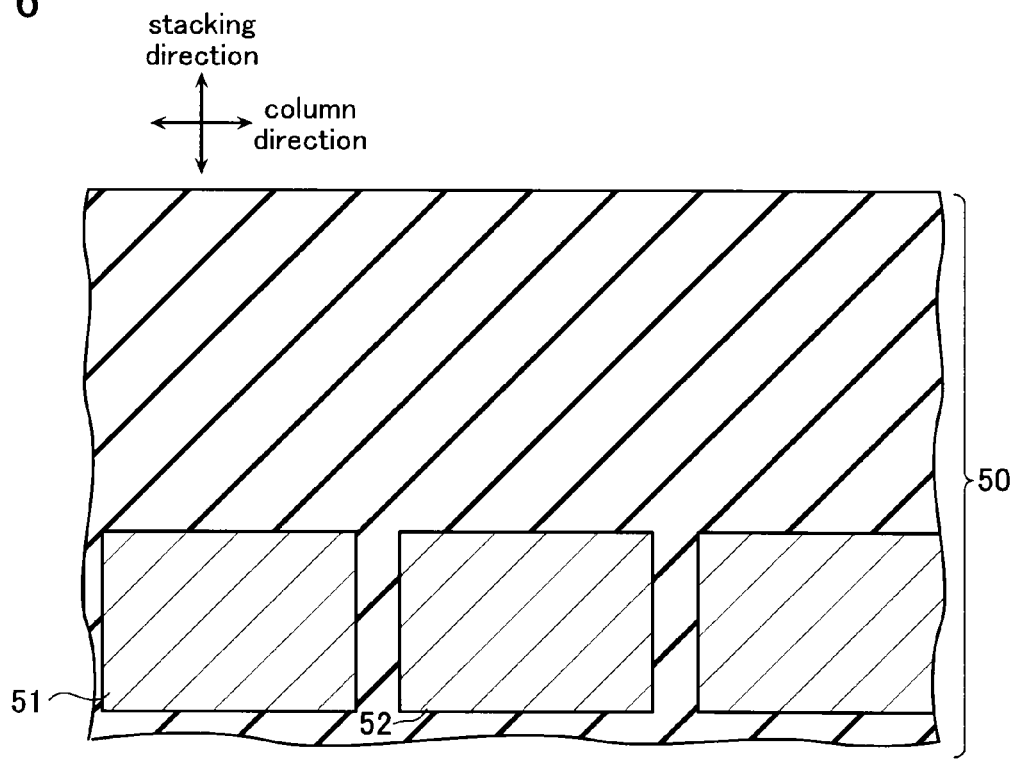
FIG. 6 is a cross-sectional view showing a manufacturing process of the nonvolatile semiconductor memory device 100 in accordance with the embodiment.

First, the back gate layer 30 and word line conductive layers 41a-41d are formed on the substrate 20. Then, as shown in FIG. 6, the drain side conductive layer 51 and the source side conductive layer 52 are formed in a layer upward of the memory transistor layer 40 so as to extend in the row direction with a certain pitch in the column direction. Note that there is an insulating layer formed in a layer downward of, on an upper surface of, and on side surfaces of the drain side conductive layer 51 and the source side conductive layer 52.

Figure 7:
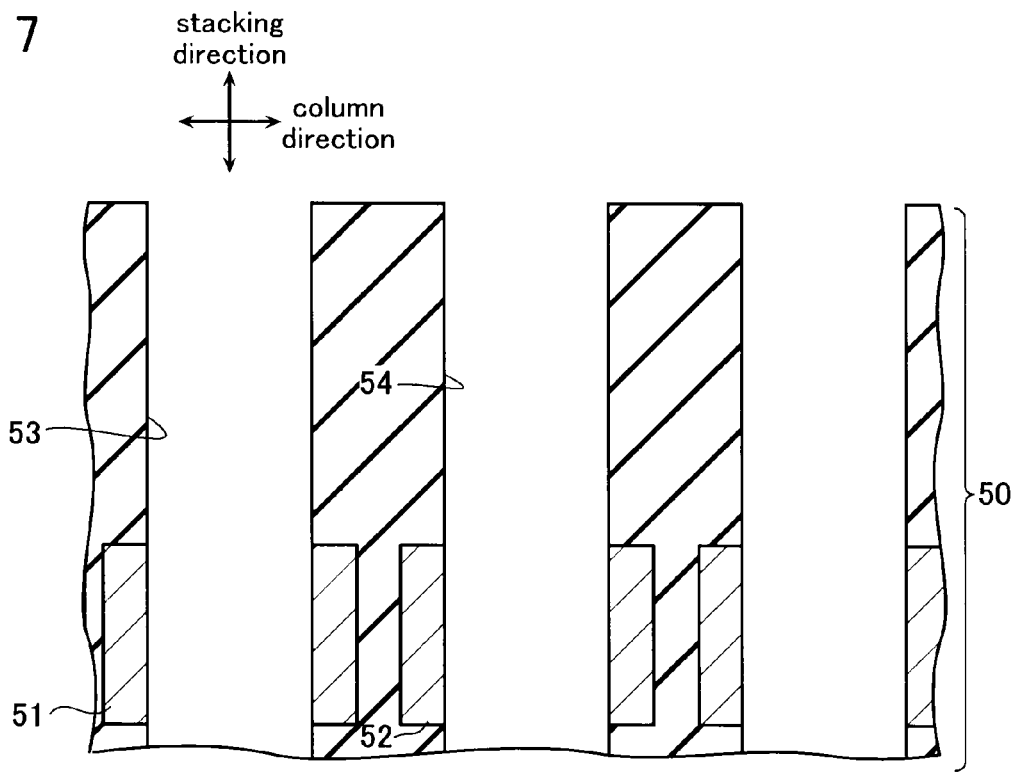
FIG. 7 is a cross-sectional view showing a manufacturing process of the nonvolatile semiconductor memory device 100 in accordance with the embodiment.

Next, as shown in FIG. 7, the drain side hole 53 and the source side hole 54 are formed so as to penetrate the drain side conductive layer 51 and the source side conductive layer 52, respectively. The drain side hole 53 and the source side hole 54 are formed in a matrix in the row direction and the column direction at a position aligning with the memory hole 43. Note that in this process the memory hole 43 which penetrates the word line conductive layers 41a-41d is formed continuously with the drain side hole 53 and the source side hole 54.

Figure 8:
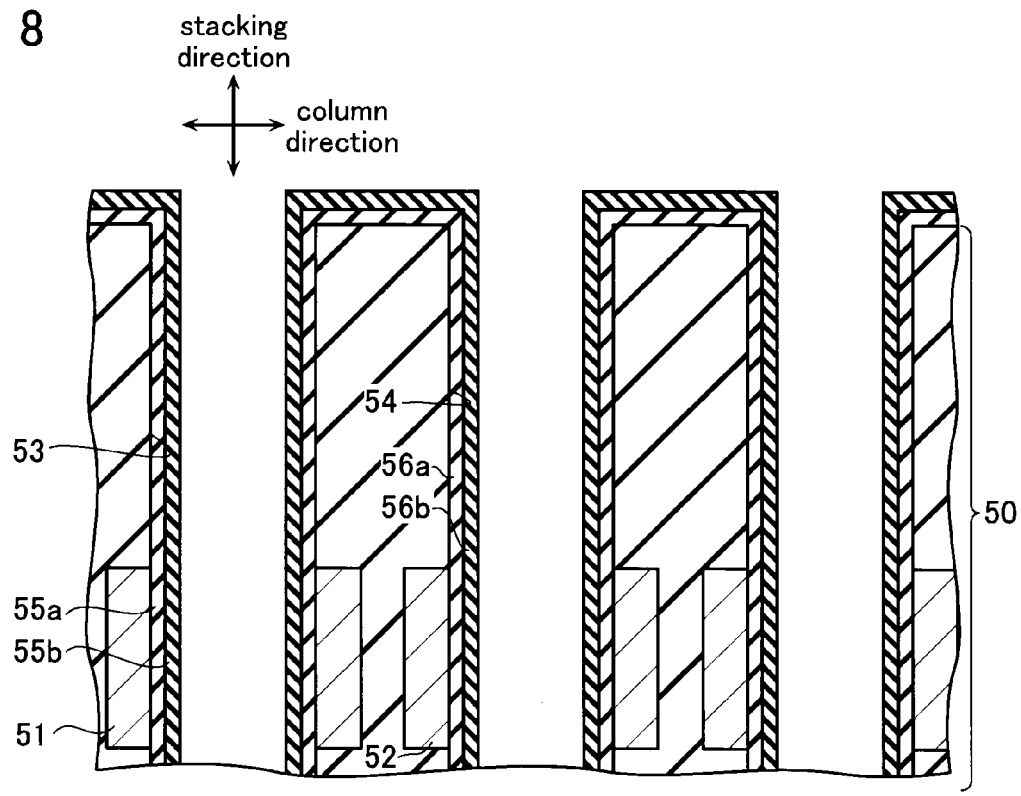
FIG. 8 is a cross-sectional view showing a manufacturing process of the nonvolatile semiconductor memory device 100 in accordance with the embodiment.

Next, as shown in FIG. 8, silicon oxide ($SiO_2$) and silicon nitride (SiN) are deposited sequentially on a side surface of the drain side hole 53 and the source side hole 54 to form the block insulating layers 55a and 56a and the charge storage layers 55b and 56b. Note that this process results in the block insulating layer 44a and the charge storage layer 44b being formed on a side surface of the memory hole 43.

Figure 9:
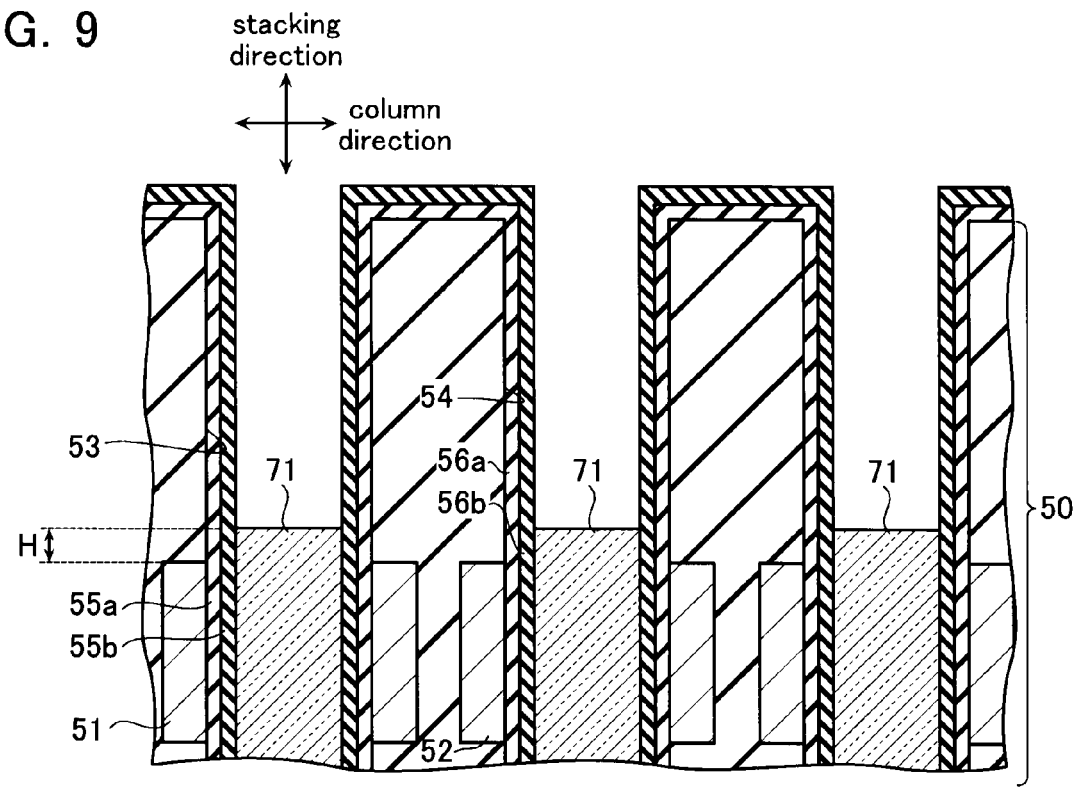
FIG. 9 is a cross-sectional view showing a manufacturing process of the nonvolatile semiconductor memory device 100 in accordance with the embodiment.

Subsequently, as shown in FIG. 9, resist 71 (protective layer) is formed inside the drain side hole 53 and the source side hole 54. The resist 71 is formed to an upper end vicinity of the drain side conductive layer 51 and the source side conductive layer 52. More specifically, the resist 71 is formed to a certain height H from the upper end of the drain side conductive layer 51 and the source side conductive layer 52.

Figure 10:
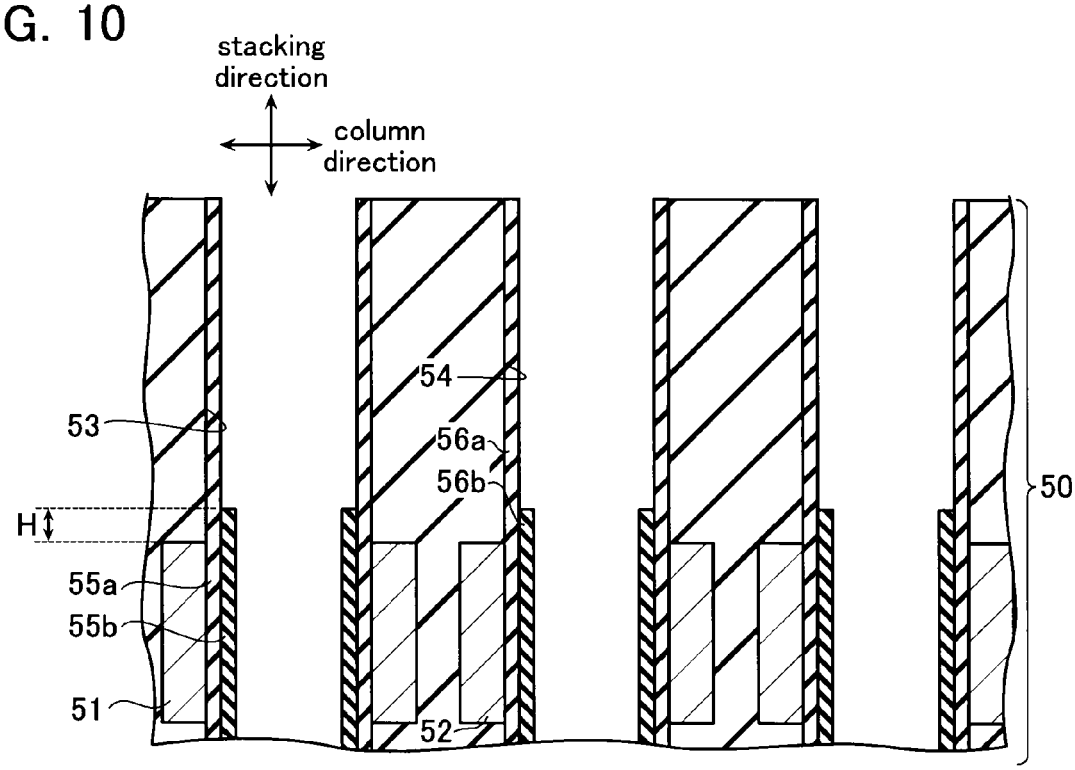
FIG. 10 is a cross-sectional view showing a manufacturing process of the nonvolatile semiconductor memory device 100 in accordance with the embodiment.

Next, as shown in FIG. 10, the charge storage layers 55b and 56b are removed to the upper end vicinity of the drain side conductive layer 51 and the source side conductive layer 52 (the certain height H from the upper end of the drain side conductive layer 51 and the source side conductive layer 52) using the resist 71 as a mask. Note that, subsequent to removing the charge storage layers 55b and 56b in the above-described manner, the resist 71 is removed.

Figure 11:
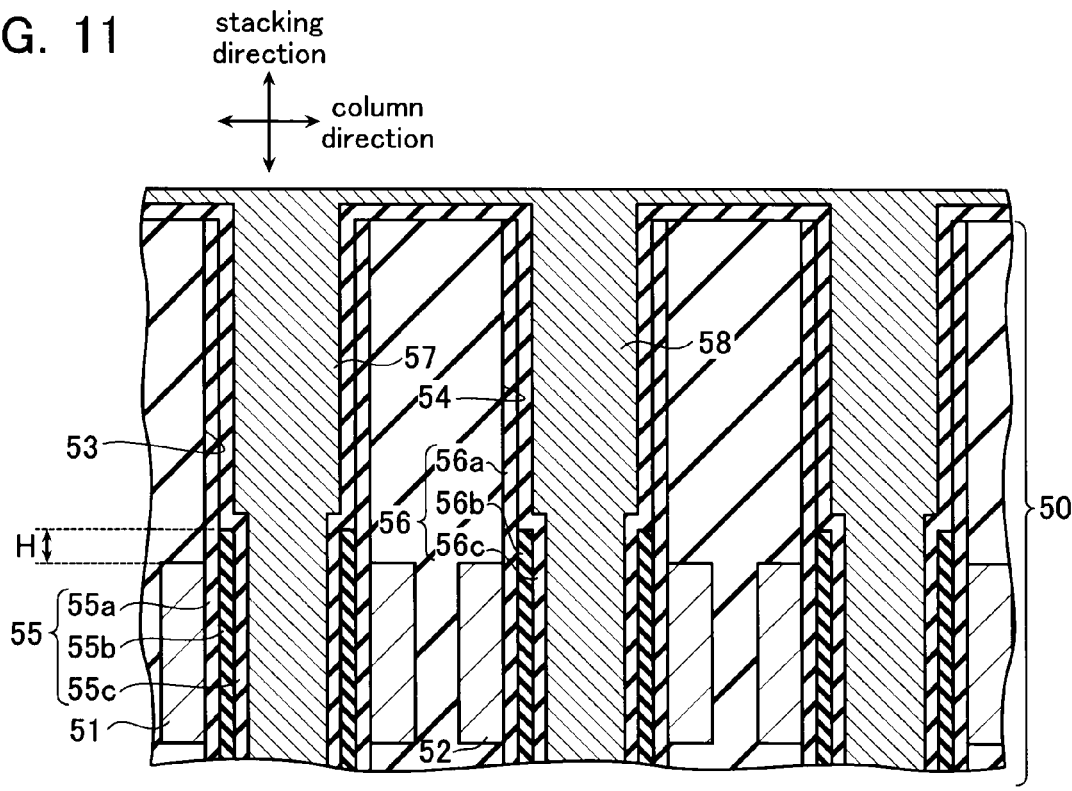
FIG. 11 is a cross-sectional view showing a manufacturing process of the nonvolatile semiconductor memory device 100 in accordance with the embodiment.

Then, as shown in FIG. 11, silicon oxide (SiO$_2$) and polysilicon (poly-Si) are deposited sequentially inside the drain side hole 53 and the source side hole 54 to form the tunnel insulating layers 55c and 56c, the drain side columnar semiconductor layer 57, and the source side columnar semiconductor layer 58. Note that this process results in the tunnel insulating layer 44c and the U-shaped semiconductor layer 45 being formed inside the memory hole 43.

Then, subsequent to the process shown in FIG. 11, a planarization treatment is performed and the wiring layer 60 formed to complete manufacture of the nonvolatile semiconductor memory device 100 shown in FIG. 4.

[Advantages of the Nonvolatile Semiconductor Memory Device 100 in Accordance with the Embodiment]

A comparative example is considered here to describe advantages of the present embodiment. A nonvolatile semiconductor memory device in accordance with the comparative example is assumed to include charge storage layers 55b and 56b that are formed along the entire side surface of the drain side hole 53 and the source side hole 54. In such a comparative example, when a charge is stored in an upper portion (vicinity of opening) of the drain side hole 53 and the source side hole 54, it is difficult for that stored charge to come under the influence of the gate electric field of the drain side select transistor SDTr and the source side select transistor SSTr. Consequently, a threshold voltage of the drain side select transistor SDTr and the source side select transistor SSTr remain in a raised state, whereby an on-state current flowing in the memory string MS remains in a lowered state.

On the other hand, in the present embodiment, the charge storage layers 55b and 56b are formed only in a layer downward of the upper end vicinity of the drain side conductive layer 51 and the source side conductive layer 52, and are not formed in a layer upward of the upper end vicinity of the drain side conductive layer and the source side conductive layer 52. Consequently, in the drain side select transistor SDTr and the source side select transistor SSTr in accordance with the present embodiment there is no storing of charge in places that cannot be controlled by the gate electric field as in the comparative example. That is, the present embodiment provides stable operation without a lowering of the on-state current.

In addition, the above-described embodiment allows the memory gate insulating layer 44, the drain side gate insulating layer 55, and the source side gate insulating layer 56 to be formed continuously in one lot by a single process. Consequently, defects sustained by these layers can be suppressed and processes simplified.

[Other Embodiments]

This concludes description of the embodiment of the nonvolatile semiconductor memory device in accordance with the present invention, but it should be noted that the present invention is not limited to the above-described embodiment, and that various alterations, additions, substitutions, and so on, are possible within a range not departing from the scope and spirit of the invention.

For example, the above-described embodiment includes a U-shaped semiconductor layer 45, but the present invention may include an I-shaped semiconductor layer extending in the stacking direction as viewed in cross-section in place of the U-shaped semiconductor layer 45 (refer to Japanese Unexamined Patent Application Publication No. 2007-266143).

For example, in the above-described embodiment, the memory gate insulating layer 44 and the drain side gate insulating layer 55, and the memory gate insulating layer 44 and the source side gate insulating layer 56 are formed continuously in an integrated manner. However, the memory gate insulating layer 44, the drain side gate insulating layer 55, and the source side gate insulating layer 56 may each be formed independently.

What is claimed is:

1. A nonvolatile semiconductor memory device, comprising:
    a memory string having a plurality of electrically rewritable memory cells connected in series; and
    a first select transistor connected to one end of the memory string and configured to be conductive when the memory string is selected,
    the memory string comprising:
    a first semiconductor layer including a columnar portion extending in a stacking direction on a substrate and functioning as a channel of the memory cells;
    a first charge storage layer surrounding the columnar portion and retaining data of the memory cells by storing a charge; and
    a plurality of first conductive layers stacked on the substrate so as to surround the first charge storage layer and functioning as control electrodes of the memory cells,
    the first select transistor comprising:
    a second semiconductor layer in contact with an upper surface of the columnar portion and extending in the stacking direction, and functioning as a channel of the first select transistor;
    a second charge storage layer surrounding the second semiconductor layer and changing a threshold voltage of the first select transistor by storing a charge; and
    a second conductive layer deposited above the first conductive layer to surround the second charge storage layer and functioning as a control electrode of the first select transistor,
    the second charge storage layer being formed from a layer downward of the second conductive layer to an upper end vicinity of the second conductive layer, and being not formed in a layer upward of the upper end vicinity.

2. The nonvolatile semiconductor memory device according to claim 1,
    wherein the second charge storage layer is formed to a position of a first height as viewed from the upper end of the second conductive layer, and
    wherein the first height is a border of a region where a voltage applied to the second conductive layer may cause a charge to be stored in or discharged from the second charge storage layer.

3. The nonvolatile semiconductor memory device according to claim 1,
    wherein the second charge storage layer is formed continuously in an integrated manner with the first charge storage layer.

4. The nonvolatile semiconductor memory device according to claim 1,
    wherein the memory string further comprises a first block insulating layer formed between the first charge storage layer and the first conductive layer,
    wherein the first select transistor further comprises a second block insulating layer formed between the second charge storage layer and the second conductive layer, and
    wherein the second block insulating layer is formed continuously in an integrated manner with the first block insulating layer.

5. The nonvolatile semiconductor memory device according to claim 4,
wherein the first block insulating layer and the second block insulating layer are constituted by silicon oxide.

6. The nonvolatile semiconductor memory device according to claim 1,
wherein the memory string further comprises a first tunnel insulating layer formed between the first charge storage layer and the first semiconductor layer,
wherein the first select transistor further comprises a second tunnel insulating layer formed between the second charge storage layer and the second semiconductor layer, and
wherein the second tunnel insulating layer is formed continuously in an integrated manner with the first tunnel insulating layer.

7. The nonvolatile semiconductor memory device according to claim 6,
wherein the first tunnel insulating layer and the second tunnel insulating layer are constituted by silicon oxide.

8. The nonvolatile semiconductor memory device according to claim 1, further comprising:
a second select transistor connected to the other end of the memory string and configured to be conductive when the memory string is selected,
wherein the first semiconductor layer further comprises a joining portion configured to join lower ends of a pair of the columnar portions,
wherein the second semiconductor layer is in contact with an upper surface of one of the pair of the columnar portions,
wherein the second select transistor comprises:
a third semiconductor layer in contact with an upper surface of the other of the pair of the columnar portions and extending in the stacking direction, and functioning as a channel of the second select transistor;
a third charge storage layer surrounding the third semiconductor layer and changing a threshold voltage of the second select transistor by storing a charge; and
a third conductive layer deposited above the first conductive layer to surround the third charge storage layer and functioning as a control electrode of the second select transistor, and
wherein the third charge storage layer is formed from a layer downward of the third conductive layer to an upper end vicinity of the third conductive layer, and is not formed in a layer upward of the upper end vicinity.

9. The nonvolatile semiconductor memory device according to claim 8,
wherein the third charge storage layer is formed to a position of a second height as viewed from the upper end of the third conductive layer, and
wherein the second height is a border of a region where a voltage applied to the third conductive layer may cause a charge to be stored in or discharged from the third charge storage layer.

10. The nonvolatile semiconductor memory device according to claim 8,
wherein the third charge storage layer is formed continuously in an integrated manner with the first charge storage layer.

11. The nonvolatile semiconductor memory device according to claim 8,
wherein the memory string further comprises a first block insulating layer formed between the first charge storage layer and the first conductive layer,
wherein the second select transistor further comprises a third block insulating layer formed between the third charge storage layer and the third conductive layer, and
wherein the third block insulating layer is formed continuously in an integrated manner with the first block insulating layer.

12. The nonvolatile semiconductor memory device according to claim 11,
wherein the first block insulating layer and the third block insulating layer are constituted by silicon oxide.

13. The nonvolatile semiconductor memory device according to claim 8,
wherein the memory string further comprises a first tunnel insulating layer formed between the first charge storage layer and the first semiconductor layer,
wherein the second select transistor further comprises a third tunnel insulating layer formed between the third charge storage layer and the third semiconductor layer, and
wherein the third tunnel insulating layer is formed continuously in an integrated manner with the first tunnel insulating layer.

14. The nonvolatile semiconductor memory device according to claim 13,
wherein the first tunnel insulating layer and the third tunnel insulating layer are constituted by silicon oxide.

15. A nonvolatile semiconductor memory device, comprising:
a memory string having a plurality of electrically rewritable memory cells connected in series; and
a select transistor connected to one end of the memory string and configured to be conductive when the memory string is selected,
the select transistor comprising:
a semiconductor layer extending in a stacking direction and functioning as a channel of the select transistor;
a charge storage layer surrounding the semiconductor layer and changing a threshold voltage of the select transistor by storing a charge; and
a conductive layer deposited to surround the charge storage layer and functioning as a control electrode of the select transistor,
the charge storage layer being formed from a layer downward of the conductive layer to an upper end vicinity of the conductive layer, and being not formed in a layer upward of the upper end vicinity.

16. The nonvolatile semiconductor memory device according to claim 15,
wherein the charge storage layer is formed to a position of a first height as viewed from the upper end of the conductive layer, and
wherein the first height is a border of a region where a voltage applied to the conductive layer may cause a charge to be stored in or discharged from the charge storage layer.

* * * * *